(12) United States Patent
Chung

(10) Patent No.: US 6,713,354 B1
(45) Date of Patent: Mar. 30, 2004

(54) CODING METHOD FOR MASK ROM

(75) Inventor: Henry Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/249,144

(22) Filed: Mar. 19, 2003

(51) Int. Cl.⁷ .......................................... H10L 21/8236
(52) U.S. Cl. ..................... 438/276; 438/277; 438/278; 438/257
(58) Field of Search ................. 438/257, 276, 438/277, 278

(56) References Cited

U.S. PATENT DOCUMENTS 6,440,803 B1 * 8/2002 Huang et al. ............... 438/276
6,482,706 B1 * 11/2002 Yeh et al. .................... 438/301

* cited by examiner

*Primary Examiner*—Dung A. Le
(74) *Attorney, Agent, or Firm*—Jinag Chyun IP Office

(57) ABSTRACT

A method of manufacturing mask ROM is provided. A buried bit line is formed in a substrate and then a gate and a word line are formed over the substrate. Thereafter, a pre-coding layer with a plurality of pre-coding openings therein is formed over the substrate in a relatively high precision process. The pre-coding openings correspond in position to a plurality of coding regions on the substrate underneath the gate. A filler material is deposited into the pre-coding openings to form a filler layer. A coding mask having a plurality of coding openings is formed over the substrate in a relatively low precision process. The filler material inside the pre-coding openings that correspond in position to the code openings in the coding mask is removed. The coding mask is removed. Finally, a coding ion implant is carried out using the pre-coding layer and the filler layer as mask and hence ions are implanted into the code region through the pre-coding openings.

21 Claims, 6 Drawing Sheets

CODING METHOD FOR MASK ROM

CROSS REFERENCE TO RELATED APPLICATIONS

This application claims the priority benefit of Taiwan application serial no. 91136981, filed Dec. 23, 2002.

BACKGROUND OF INVENTION

1. Field of Invention

The present invention relates to a method of manufacturing memory. More particularly, the present invention relates to a method of manufacturing mask read-only-memory (mask ROM).

2. Description of Related Art

Mask read-only-memory (mask ROM) is a type of non-volatile memory that retains data even after power supply is turned off. Due to its versatility, mask ROM has been used for many kinds of computers and electronic products. Conventionally, buried bit lines and words lines are prefabricated in factory as semi-finished products before any order for production is received to save time. When an order is received, a photomask is fabricated according to the specification and then used to carry out the coding process.

A typical coding process includes forming a photoresist layer over a substrate. Thereafter, the photoresist layer is photo-exposed using the photomask fabricated according to the specification. After developing the exposed photoresist, the photoresist layer with coding openings therein is used as a mask to carry out an ion implantation. In this way, ions are implanted into the substrate in regions exposed by the coding openings so that correct codes are set up in the mask ROM.

Following the recent trend of miniaturization, the mask ROM is also required to reach a high level of integration. However, as the size of devices on a chip is shrunk and device density is increased, many problems appear in the conventional method of manufacturing mask ROM.

One of the problems of using a conventional mask ROM manufacturing method is that any alignment error in the process of forming the patterned photoresist layer may lead to a shift in the coding openings. Hence, coding ions may be implanted into a neighboring region instead of the correct coding region leading to the appearance of some coding errors in the finished mask ROM.

Another problem of using the conventional mask ROM manufacturing method is that micro-loading effect due to differences in density of coding openings often leads to size and shape deviation in region with sparse coding openings. If the situation is serious enough, some coding openings may remain close. Since a shift in the critical dimension and shape of coding openings has a direct effect on the location of the code implant regions, precision of the coding process may be severely affected.

To combat the aforementioned problems, pattern on the photomask is often modified with the most advanced processing equipment. However, this will increase processing complexity as well as photomask fabrication cost. Moreover, the turnaround time (TAT) of mask ROM will also be increased due to a longer photomask fabrication turnaround.

SUMMARY OF INVENTION

Accordingly, one object of the present invention is to provide a method of manufacturing mask read-only-memory (mask ROM) capable of preventing problems caused by a shifting of coding openings from the desired coding region that results from a misalignment of coding mask.

A second object of this invention is to provide a method of manufacturing mask ROM capable of preventing problems caused by a variation in size of coding openings due to a conventional method of fabricating the coding mask.

A third object of this invention is to provide a method of manufacturing mask ROM that produces a higher level of integration but at a lower cost.

A fourth object of this invention is to provide a method of manufacturing mask ROM that has a widen process window.

A fifth object of this invention is to provide a method of manufacturing a mask ROM that has a shorter turnaround time.

To achieve these and other advantages and in accordance with the purpose of the invention, as embodied and broadly described herein, the invention provides a method of manufacturing mask ROM. A buried bit line is formed in a substrate and then a gate and a word line are formed over the substrate. Thereafter, a pre-coding layer with a plurality of pre-coding openings therein is formed over the substrate. The pre-coding openings correspond in position to a plurality of coding regions on the substrate underneath the gate. A filler material is deposited into the pre-coding openings to form a filler layer. A coding mask having a plurality of coding openings is next formed over the substrate. The filler material inside the pre-coding openings that correspond in position to the code openings in the coding mask is removed. The coding mask is removed. Finally, a coding ion implant is carried out using the pre-coding layer and the filler layer as a mask. The ions are implanted into the code region through the pre-coding openings.

According to the embodiment of this invention, a higher precision process is used to form the pre-coding openings in the pre-coding layer while a lower precision process is used to form the coding openings in the coding mask. In addition, the pre-coding layer and the filler layer are made from materials having a different etching rate. The coding layer is fabricated using a material such as silicon oxide, silicon nitride or a metal. The filler layer is fabricated using a material such as spin-coated glass, metal or silicon nitride. If the coding layer or the filler layer is made from a metallic material, the metallic coding layer or filler layer must be removed after the coding ion implant. Furthermore, the filler layer exposed by the coding opening can be removed by carrying out a wet etching process.

Because the pre-coding layer and the filler layer are fabricated using materials having a different etching rate, the coding openings in the mask layer only need to expose a portion of the filler layer above the required coding regions. In a subsequent etching step, the filler layer above the required coding regions can be completely removed by selection. Thus, if the pre-coding openings in the pre-coding layer are precisely aligned to the coding regions in the substrate, the ions in the coding implant process will automatically fall into the desired coding regions. In other words, while patterning the coding openings in the mask layer, even if there is some misalignment in the photolithographic process or some micro-loading effect in the etching process, as long as the coding opening is able to expose a portion of the filler layer above the desired coding region, the etching selectivity of the filler layer and the pre-coding layer can be utilized to form pre-coding openings having uniform shape and size above the pre-coding regions so that implanting ions may self-align with the coding regions.

Since the coding openings in the mask layer is required to expose a portion of the 999 filler layer above the desired coding regions only, processing window is increased so that machinery having a slightly lower precision can be used for the coding process. Moreover, less sophisticated mask-making technique may be employed to form the photomask for patterning the coding openings and to shorten overall turnaround time (TAT). In addition, lower precision photoresist may be used to form the mask layer to lower the production cost even further.

Furthermore, the pre-coding opening in the pre-coding layer has a uniform density. Hence, less sophisticated mask-making technique is required to form the photomask for patterning the pre-coding openings. Moreover, identical pre-coding openings are needed whatever the coding scheme for the memory devices. Therefore, the mask for forming pre-coding openings is applicable to various types of products. Thus, in the fabrication of mask ROM, pre-existing pre-coding mask can be used to pattern the pre-coding layer. In other words, this invention is able to lower overall production cost of a mask ROM, increases processing window and shortens delivery time.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2 is the top view of FIG. 1 and FIG. 8 is the top view of FIG. 7.

DETAILED DESCRIPTION

Figure 1:
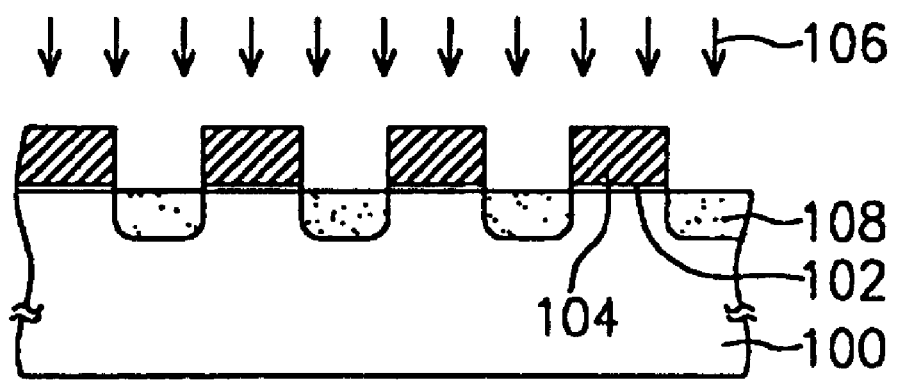
FIGS. 1 to 11 are diagrams showing the steps for fabricating a mask ROM according to one embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
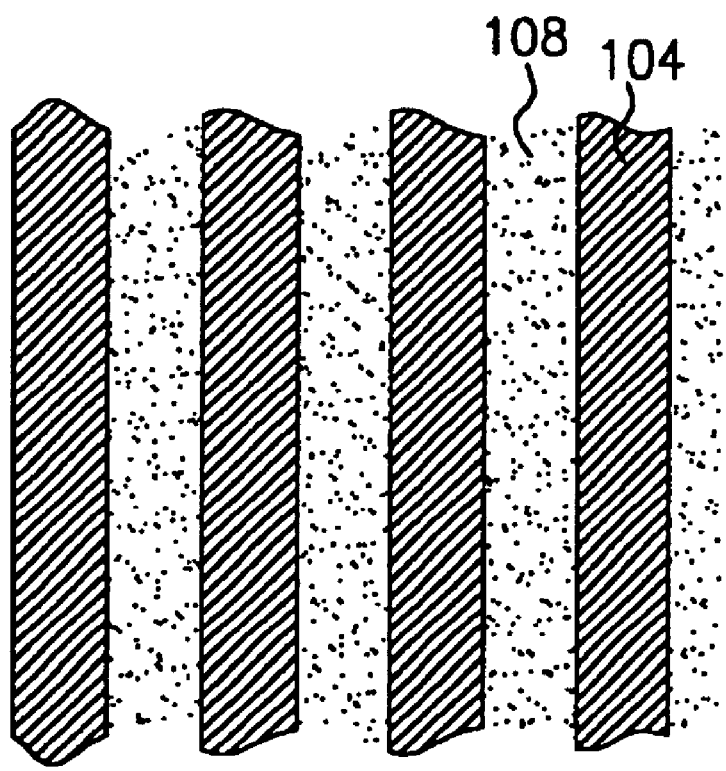

FIGS. 1 to 11 are diagrams showing the steps for fabricating a mask ROM according to one embodiment of this invention. As shown in FIG. 1, a gate dielectric layer 102 and a plurality of conductive lines 104 are formed over a substrate 100. The gate dielectric layer 102 is formed, for example, by thermal oxidation. The conductive lines 104 are doped polysilicon layers formed, for example, by chemical vapor deposition. Thereafter, using the conductive layer 104 as a mask, an ion implantation 106 is carried out to form a plurality of buried bit lines 108 in the substrate 100. N-type ions are used in the ion implantation 106, for example. FIG. 2 is a top view of the device in FIG. 1.

Figure 3:
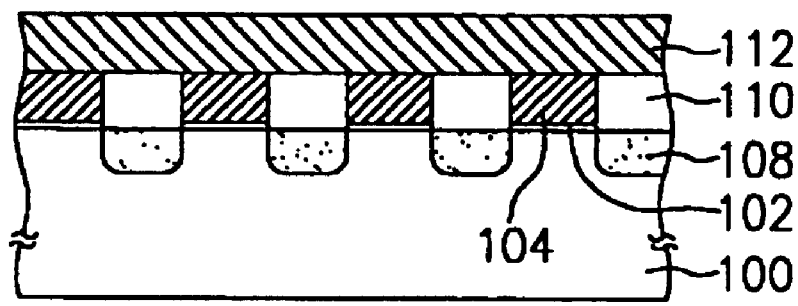

As shown in FIG. 3, dielectric material is deposited into the space between the conductive lines 104 to form a dielectric layer 110. A conductive layer 112 is formed over the dielectric layer 110 and the conductive layer 104. The dielectric layer 110 is a silicon oxide layer formed, for example, by forming a silicon oxide layer over the entire substrate 100 and then back etching or chemical-mechanical polishing the oxide layer to remove that portion of the oxide layer above the conductive layer 104. The conductive layer 104 is a composite layer comprising a polysilicon layer and metal suicide layer formed, for example, by chemical vapor deposition.

Figure 4:
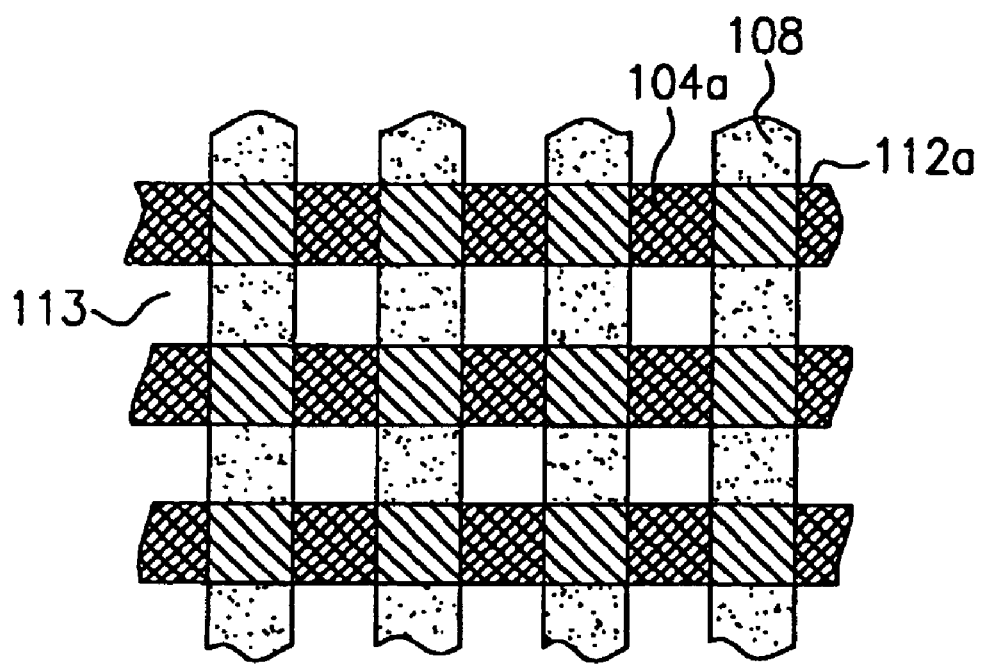

Thereafter, photolithographic and etching processes are conducted to pattern the conductive layer 112 into word lines 112a and remove the exposed conductive line 104 so that the conductive lines 104a underneath the word lines 112a become a gate. Dielectric material is deposited into the space between the word lines 112a to form a dielectric layer 113. The dielectric layer 113 is a silicon oxide layer formed, for example, by depositing oxide material over the entire substrate and the back etching or chemical-mechanical polishing the oxide layer to remove a portion of the oxide layer above the word lines 112a. After these processing steps, the device has a cross-sectional view a shown in FIG. 3 and a top view as shown in FIG. 4.

Figure 5:
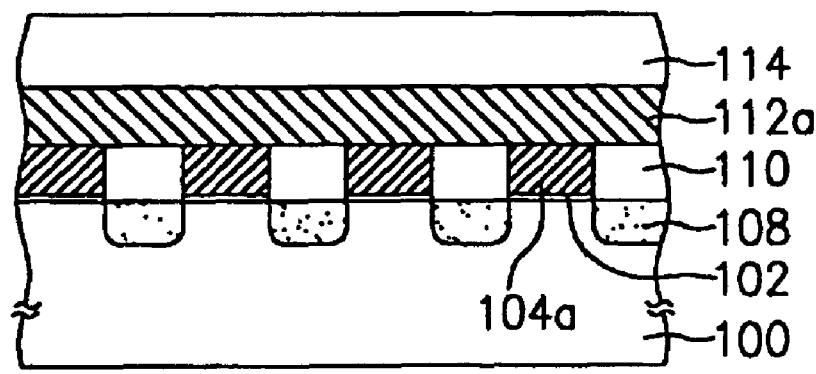
Figure 6:
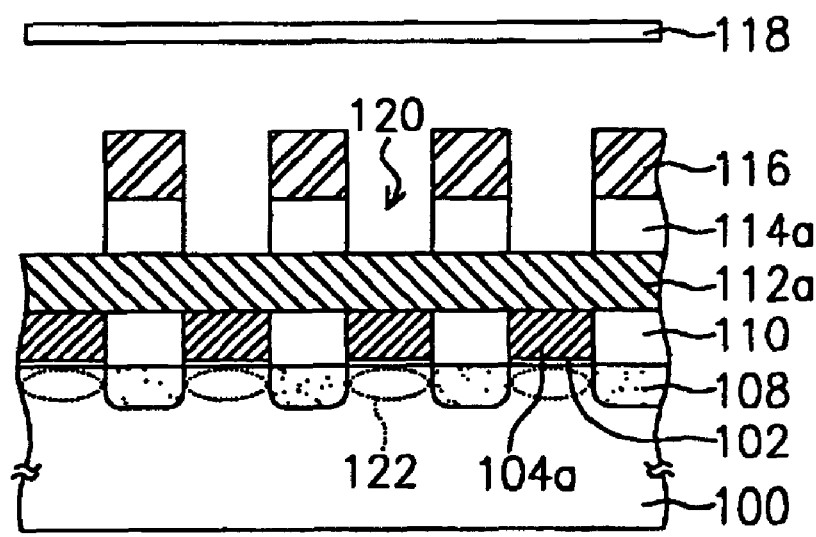

A pre-coding layer 114 is formed over the word lines 112a and the dielectric layer 113 as shown in FIG. 5. A photoresist layer 116 is formed over the pre-coding layer 114 as shown in FIG. 6. A photolithographic process is conducted to transfer the pattern on a photomask 118 to the photoresist layer 116. Thereafter using the photoresist layer 116 as an etching mask, the pre-coding layer 114 is etched to form a plurality of pre-coding openings 120 in the pre-coding layer 114a. The pre-coding openings 120 correspond in position to the coding regions 122 in the substrate 100. Since the pre-coding openings 120 in the pre-coding layer 114a have a uniform density, less sophisticated mask-making technique can be used to fabrucate the photomask 118. On the other hand, the pre-coding layer 114a is patterned with a high precision. That is, more advanced equipment is used to carry out the photo-exposure of photoresist and high-resolution photoresist material is used to form the photoresist layer 116. Furthermore, because the density of the coding openings on the memory region of the substrate 100 is uniform, the process of forming the pre-coding openings 120 through etching will not cause any micro-loading effect. Thus, shape and size of the pre-coding openings 120 is rather uniform.

Figure 7:
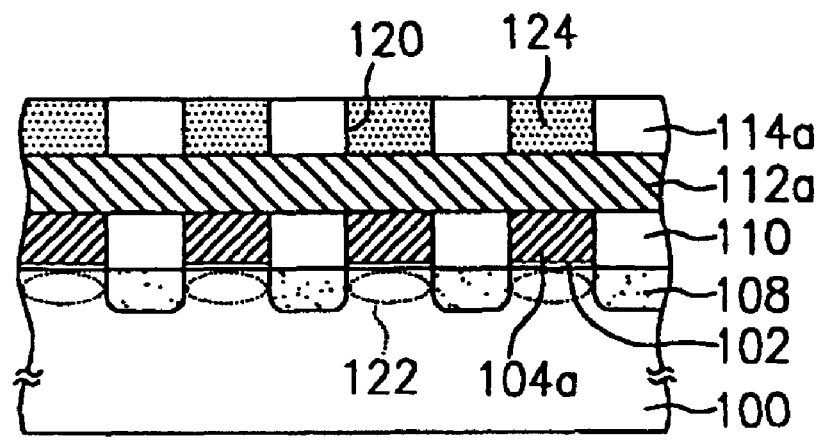
Figure 8:
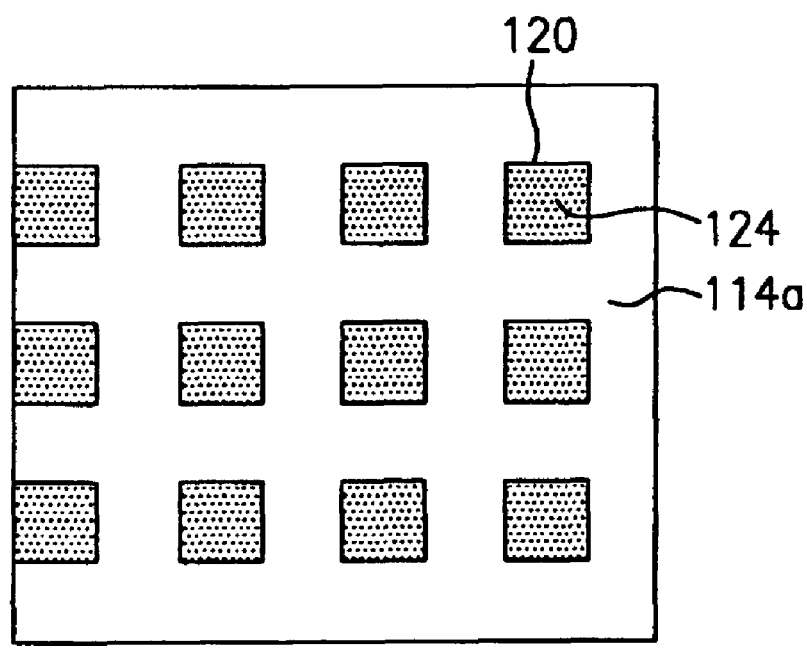

As shown in FIG. 7, a filler material is deposited into the pre-coding opening 120 to form a filler layer 124 such that each filler layer 124 corresponds in position to a coding region 122 in the substrate 100. FIG. 8 is a top view of the device in FIG. 7.

Etching rates of the filler layer 124 and the pre-coding layer 114a is different because they are fabricated using different materials. The pre-coding layer 114a is made from a material such as silicon oxide, silicon nitride or metal. On the other hand, the filler layer 124 is made from a material such as spin-coated glass, metal or silicon oxide. For example, if the pre-coding layer 114a is a silicon oxide layer or a silicon nitride layer, the filler layer 124 is a spin-coated glass layer or a metallic layer. The metallic layer comprises of a barrier layer made from titanium/titanium nitride and a tungsten layer. If the pre-coding layer 114a is a metallic layer, the filler layer 124 is a spin-coated glass layer or a silicon oxide layer.

Figure 9:
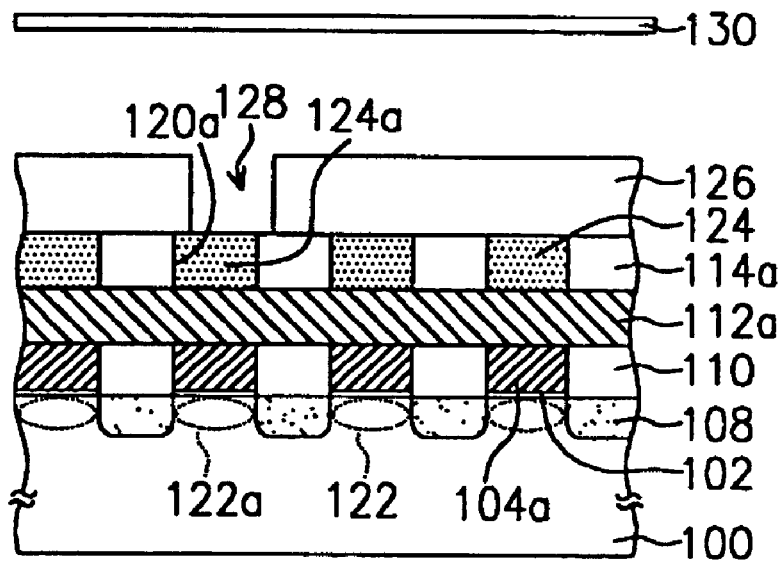

As shown in FIG. 9, a mask layer 126 such as a photoresist layer is formed over the pre-coding layer 114a and the filler layer 124. Using a photomask 130, a photolithographic process is carried out to transfer a pattern on the photomask 130 to the mask layer 126 so that code openings 128 are formed in the mask layer 126. The code openings 128 expose corresponding filler layer 124a in the pre-coding openings 120a. In other words, the code openings 128 expose the filler layer 124a above the code regions 122a. The patterning of the mask layer can be carried out with less precision. For example, a low-precision photoresist material can be used to form the mask layer 126, a less sophisticated mask-making technique can be used to fabricate the photomask 130 and equipment with lower precision can be used to carry out the photo-exposure process.

Figure 10:
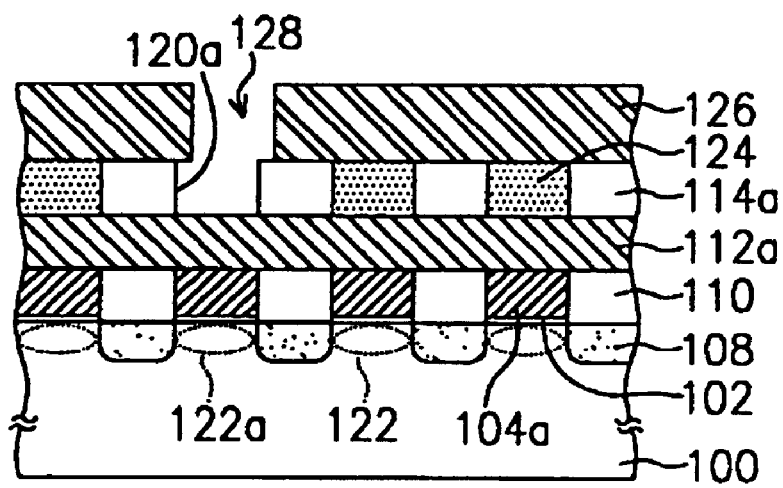

As shown in FIG. 10, the filler layer 124a within the pre-coding opening 120a is completely removed using the mask layer 126 as a mask. In other words, the filler layer 124a above the coding region 122a is completely removed. Since the pre-coding layer 114a and the filler layer 124 are fabricated from materials having a different etching rate, the filler layer 124a can be removed using a selective isotropic etching method. Preferably, a wet etching process using hydrofluoric acid solution as an etching solution is used. After completely removing the filler layer 124a above the coding region 122a, the substrate 100 is covered by the pre-coding layer 114a. The pre-coding openings 120 in the pre-coding layer 114a are in either one of two states. The pre-coding openings 120 are either completely filled with a filler material or free of any filler material and hence expose the underlying layer. Those coding openings 120 that are exposed all have identical size and shape.

Figure 11:
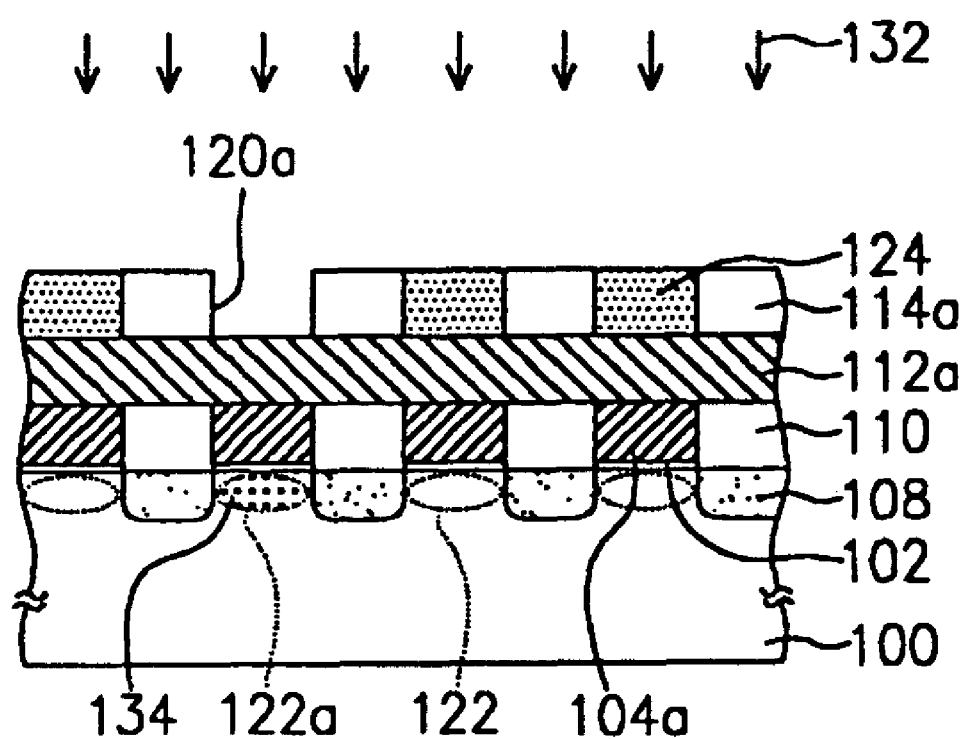

As shown in FIG. 11, the mask layer 126 is removed. Thereafter, using the pre-coding layer 114a and the filler layer 124 as a mask, an ion implantation 132 is carried out. Ions 134 are implanted into coding regions 122a through the pre-coding opening 120a whose filler layer 124a has been removed. The ions implanted into the coding region 122a in the coding implantation 132 may be identical or different from the ions already in the buried bit lines 108, for example, p-type ions.

If the pre-coding layer 114a or the metallic layer 124 are metallic layers, the pre-coding layer 114a and the filler layer 124 must be removed after the coding implantation 132.

In summary, this invention uses a relatively high precision photomask to pattern out an array of pre-coding openings in a pre-coding layer and then uses another relatively low precision photomask to pattern out an array of coding openings in a mask layer. Thereafter, using the mask layer as an etching mask, the filler layers within the pre-coding openings that correspond to the coding openings are removed. Finally, using the pre-coding layer and the filler layers as a masks, a coding ion implant is carried out so that ions are implanted into code regions through the pre-coding openings whose filler material has been removed previously.

The pre-coding layer and the filler layer are fabricated using materials having a different etching rate. Hence, the coding openings in the mask layer only have to expose a portion of the filler layer above the code regions because the filler layer above the code regions will be selectively removed in a subsequent etching operation. Therefore, as long as the pre-coding openings in the pre-coding layer is precisely aligned to the code regions in the substrate, ions in the coding implant are self-aligned to the desired code regions. In other words, even if there is any misalignment in the photolithographic process or any micro-loading effect in the etching process when the code openings in the mask layer is patterned, as long as the code openings expose a portion of the filler layer above the code regions, etching selectivity between the filler layer and the pre-coding layer can be utilized to form pre-coding openings having an identical size and shape above the code regions. In a subsequent ion implantation, ions are self-aligned to the code regions.

Since the coding openings in the mask layer only have to expose a portion of the filler layer above the desired coding regions, processing window is increased so that machinery having a slightly lower precision can be used for the coding process. Moreover, less sophisticated mask-making technique may be employed to fabricate the photomask for patterning the coding openings and to shorten the overall turnaround time. In addition, low-precision photoresist material may be used to fabricate the mask layer to lower the production cost even further.

Furthermore, the pre-coding opening in the pre-coding layer has a uniform density. Hence, less sophisticated mask-making technique Is required to fabricate the photomask for patterning the pre-coding openings. Moreover, identical pre-coding openings are needed whatever the coding scheme for the memory devices. Therefore, a high precision photomask can be applied to the fabrication of various types of products. Thus, in the fabrication of mask ROM, pre-existing pre-coding mask can be used to pattern the pre-coding layer. In other words, this invention is able to lower overall manufacturing cost of a mask ROM, increases processing window and shortens delivery time.

All in all, this invention provides a memory device having a higher level of integration, a wider processing window, an improved reliability, a lower production cost and a faster turnaround time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing mask read-only-memory, comprising the steps of:

providing a substrate;

forming a plurality of buried bit lines in the substrate and a plurality of word lines over the substrate, wherein the word lines are perpendicular to the buried bit lines, a gate is formed in the substrate between any two buried bit lines underneath each word line and a dielectric layer is formed between the gates and the word lines;

forming a pre-coding layer over the substrate;

forming a plurality of pre-coding openings in the pre-coding layer, wherein the pre-coding openings correspond in position to the plurality of coding regions in the substrate underneath the gates;

forming a filler layer inside the pre-coding openings;

forming a coding mask over the substrate;

forming at least one coding opening in the coding mask, wherein the coding opening at least exposes the filler layer inside a first pre-coding openings of the pre-coding openings;

removing the filler layer inside the first pre-coding opening;

removing the coding mask; and conducting an ion implantation using the pre-coding layer and the filler layer inside the pre-coding openings as a mask so that ions are implanted into the code regions through the first pre-coding openings.

2. The method of claim 1, wherein the step of forming the buried bit lines, the word lines, the gates and the dielectric layers includes the sub-steps of:

forming a gate dielectric layer over the substrate;

forming a plurality of conductive lines over the gate dielectric layer;

conducting a coding ion implant using the conductive lines as a mask so that buried bit lines are formed in the substrate;

forming a first dielectric layer between the conductive lines;

forming a conductive layer over the substrate;

patterning the conductive layer and the conductive lines at the same time to form the word lines and the gates; and depositing dielectric material into the space between the word lines to form a second dielectric layer, wherein the first and the second dielectric layer together constitute the dielectric layer.

3. The method of claim 1, wherein the pre-coding layer and the filler layer are fabricated from materials having a different etching rate.

4. The method of claim 3, wherein material constituting the pre-coding layer is selected from a group consisting of silicon oxide, silicon nitride and metal.

5. The method of claim 4, wherein after the step of conducting a coding ion implant, further includes removing the pre-coding layer if the pre-coding layer is a metallic layer.

6. The method of claim 3, wherein material constituting the filler layer is selected from a group consisting of spin-coated glass, metal and silicon oxide.

7. The method of claim 6, wherein after the step of conducting a coding ion implant, further includes removing the filler layer if the filler layer is a metallic layer.

8. The method of claim 1, wherein a relatively higher precision process is used in the step of forming pre-coding openings in the pre-coding layer compared with the step of forming the coding openings in the coding mask.

9. The method of claim 1, wherein the step of removing the exposed filler layer inside the first pre-coding opening includes conducting an isotropic etching.

10. The method of claim 9, wherein the step of removing the exposed filler layer inside the first pre-coding openings includes wet etching.

11. The method of claim 1, wherein the coding mask includes a photoresist layer.

12. A method of coding memory, comprising the steps of:

providing a substrate;

forming a pre-coding mask layer over the substrate;

forming a plurality of pre-coding openings in the pre-coding layer, wherein the pre-coding openings correspond in position to a plurality of code regions in the substrate;

depositing filler material into the pre-coding opening to form filler layers;

forming a coding mask over the substrate;

forming at least one code opening in the coding mask, wherein the coding opening at least exposes the filler layer inside a first pre-coding opening;

removing the filler layer inside the first pre-coding openings;

removing the coding mask; and conducting an coding ion implant using the pre-coding layer and the filler layer inside the pre-coding opening so that ions are implanted into the code regions through a corresponding first pre-coding opening.

13. The method of claim 12, wherein the pre-coding layer and the filler layer are fabricated from materials having a different etching rate.

14. The method of claim 13, wherein material constituting the pre-coding layer is selected from a group consisting of silicon oxide, silicon nitride and metal.

15. The method of claim 14, wherein after the step of conducting a coding ion implant, further includes removing the pre-coding layer if the pre-coding layer is a metallic layer.

16. The method of claim 13, wherein material constituting the filler layer is selected from a group consisting of spin-coated glass, metal and silicon oxide.

17. The method of claim 16, wherein after the step of conducting a coding ion implant, further includes removing the filler layer if the filler layer is a metallic layer.

18. The method of claim 12, wherein the step of removing the exposed filler layer inside the first pre-coding opening includes conducting an isotropic etching.

19. The method of claim 18, wherein the step of removing the exposed filler layer inside the first pre-coding openings includes wet etching.

20. The method of claim 12, wherein the coding mask includes a photoresist layer.

21. The method of claim 12, wherein a relatively higher precision process is used in the step of forming pre-coding openings in the pre-coding layer compared with the step of forming the coding openings in the coding mask.

* * * * *